United States Patent
Yoo et al.

(10) Patent No.: US 8,730,727 B2
(45) Date of Patent: May 20, 2014

(54) 3D NON-VOLATILE MEMORY DEVICE AND METHOD FOR OPERATING AND FABRICATING THE SAME

(75) Inventors: Hyun-Seung Yoo, Gyeonggi-do (KR); Eun-Seok Choi, Gyeonggi-do (KR); Se-Jun Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 266 days.

(21) Appl. No.: 12/907,560

(22) Filed: Oct. 19, 2010

(65) Prior Publication Data

US 2011/0090737 A1    Apr. 21, 2011

(30) Foreign Application Priority Data

Oct. 19, 2009  (KR) ................. 10-2009-0099233

(51) Int. Cl.
*G11C 16/04* (2006.01)
(52) U.S. Cl.
USPC ............. 365/185.11; 365/185.18; 365/185.19
(58) Field of Classification Search
USPC ............. 365/185.11, 185.18, 185.29, 185.19; 257/314, 316
See application file for complete search history.

(56) References Cited

U.S. PATENT DOCUMENTS

| | | | |
|---|---|---|---|
| 7,960,844 B2* | 6/2011 | Jang et al. | 257/777 |
| 2007/0257305 A1* | 11/2007 | Sasago et al. | 257/316 |
| 2009/0267128 A1* | 10/2009 | Maejima | 257/314 |
| 2009/0310425 A1* | 12/2009 | Sim et al. | 365/185.29 |
| 2010/0226195 A1* | 9/2010 | Lue | 365/230.06 |

FOREIGN PATENT DOCUMENTS

| | | |
|---|---|---|
| JP | 2009-224574 | 10/2009 |
| KR | 1020070070477 | 7/2007 |
| KR | 1020070096972 | 10/2007 |
| KR | 1020080070583 | 7/2008 |

OTHER PUBLICATIONS

Yosuke Komori et al., "Disturbless Flash Memory due to High Boost Efficiency on BiCS Structure and Optimal Memory Film Stack for Ultra High Density Storage Device," IEEE, 2008, pp. 851-854.
H. Tanaka et al., "Bit Cost Scalable Technology with Punch and Plug Process for Ultra High Density Flash Memory," Symposium on VLSI Technology Digest of Technical Papers, 2007, pp. 14-15.
Yoshiaki Fukuzumi et al., "Optimal Integration and Characteristics of Vertical Array Devices for Ultra-High Density, Bit-Cost Scalable Flash Memory," IEEE, 2007, pp. 449-452.
Notice of Preliminary Rejection issued from Korean Intellectual Property Office on May 4, 2011.

* cited by examiner

*Primary Examiner* — Huan Hoang
*Assistant Examiner* — Tri Hoang
(74) *Attorney, Agent, or Firm* — IP & T Group LLP

(57) ABSTRACT

A 3D non-volatile memory device includes a plate-type lower select line formed over a substrate, a lower select transistor formed in the lower select line, a plurality of memory cells stacked over the lower select transistor, an upper select transistor formed over the memory cells, and a line-type common source line formed over the substrate and spaced from the lower select line.

5 Claims, 21 Drawing Sheets

3D NON-VOLATILE MEMORY DEVICE AND METHOD FOR OPERATING AND FABRICATING THE SAME

CROSS-REFERENCE TO RELATED APPLICATIONS

The present application claims priority of Korean Patent Application No. 10-2009-0099233, filed on Oct. 19, 2009, which is incorporated herein by reference in its entirety.

BACKGROUND OF THE INVENTION

Exemplary embodiments of the present invention relate to a semiconductor device and a method for fabricating the same, and more particularly, to a 3D non-volatile memory device and a method for fabricating the same.

A non-volatile memory device is a memory device which is capable of maintaining data stored therein, even though power supply is cut off. As a 2D memory device in which memory cells are formed as a single layer on a silicon substrate is reaching its limits in achieving high integration, a 3D non-volatile memory device is being developed, in which memory cells are vertically stacked on a silicon substrate.

Hereafter, the structure of a conventional 3D non-volatile memory device and the concern therein are described with reference to FIG. 1.

FIG. 1 is a cross-sectional view illustrating the structure of the conventional 3D non-volatile memory device and a method for fabricating the same.

Referring to FIG. 1, a source area S is formed by implanting ion impurities into a substrate 10. In general, the source area S may be formed by implanting N-type ion impurities.

A plurality of interlayer dielectric layers 11 and conductive layers 12 are formed on the substrate 10 having the source area S formed therein, and then etched to form a trench exposing the surface of the substrate 10.

A gate dielectric layer 13 is formed on the inner wall of the trench, and a channel layer is buried to form a channel CH. In general, the channel CH may be formed of a poly silicon layer doped with N-type impurities or an undoped poly silicon layer. Through this process, a lower select transistor LST is formed.

On the resultant structure having the lower select transistor LST formed therein, a plurality of interlayer dielectric layers 14 and conductive layers 15 are formed. The number of interlayer dielectric layers 14 and conductive layers 15 to be stacked is determined depending on the number of memory cells to be stacked.

The plurality of interlayer dielectric layers 14 and conductive layers 15 are etched to form a trench exposing the channel CH of the lower select transistor LST.

A charge blocking layer, a charge trap layer, and a tunnel insulating layer are sequentially formed on the inner wall of the trench, and a channel layer is buried to form a channel CH. For convenience of description, the charge blocking layer, the charge trap layer, and the tunnel insulating layer are illustrated as one layer represented by reference numeral 16. In general, the channel CH may be formed of a poly silicon layer doped with N-type impurities or an undoped poly silicon layer. Through this process, a plurality of memory cells MC are formed.

On the resultant structure having the plurality of memory cells MC formed therein, a plurality of interlayer dielectric layers 17 and conductive layers 18 are formed, and then etched to form a trench exposing the channel CH of the memory cells MC.

A gate dielectric layer 19 is formed on the inner wall of the trench, and a channel layer is buried to form a channel CH. In general, the channel CH may be formed of a poly silicon layer doped with N-type impurities or an undoped poly silicon layer. Through this process, an upper select transistor UST is formed.

The plurality of memory cells MC are connected in series between the lower select transistor LST and the upper select transistor UST so as to form one string ST.

In accordance with the conventional 3D non-volatile memory device described above, the process of fabricating the memory device is relatively complex, and the performance of the memory device may be degraded. These concerns are described in more detail as follows.

First, independent processes are performed on a cell area and a peripheral circuit area, respectively. That is, the process of forming the lower select transistor LST, the plurality of memory cells MC, and the upper select transistor UST in the cell area and the process of forming transistors in the peripheral circuit area are separately performed. Therefore, the fabricating process thereof is complex, and the manufacturing cost is relatively high.

Second, since the channels of the select transistors LST and UST are formed of amorphous silicon or polycrystalline silicon, on/off characteristics of the select transistors LST and UST may be degraded, and it may be difficult to control the threshold voltage of the transistors.

Third, since the source area S is formed by implanting N-type ion impurities into the substrate 10, the source area S has high resistance. Therefore, it is highly likely that an error occurs due to the resistance component of the source area S during a read operation.

Fourth, the speed of transferring an erase voltage may be relatively low.

An erase operation is performed by injecting holes into a charge capture layer of a memory cell. Therefore, it is desired to be provided with a P-type source for supplying the holes. In accordance with the conventional 3D non-volatile memory device, however, the channels CH are connected to the N-type source area S, not the P-type source. Therefore, when a positive erase voltage is applied to a bit line and the source area S to perform the erase operation, depletion phenomenon may occur. Accordingly, it takes a considerable amount of time for the positive erase voltage to be transferred to the channels CH of the memory cells, and the speed of the erase operation of the memory device is reduced.

To address such concerns, a method has been developed, which causes gate induced drain leakage (GIDL) current to provide holes. That is, the GIDL current is caused by ramping the bit line, the source area S, the upper select transistor UST, and the lower select transistor LST with certain time differences. As such, the hole of the electron-hole pair which is formed by the intentionally caused GIDL current is supplied to the channel CH of the memory cell MC to perform the erase operation.

However, when the high-level erase voltage is applied to ramp the bit line, the upper select transistor UST, and the lower select transistor LST, the threshold voltages of the upper and lower select transistors UST and LST are varied, and the channels CH are damaged. Then, the reliability of the semiconductor chip may be reduced. Furthermore, although the GIDL current is forcibly caused to supply the holes, it is difficult to uniformly distribute the generated holes to the channels CH of the plurality of memory cells MC. Furthermore, since the bit line, the source area S, the upper select transistor UST, and the lower select transistor LST are all ramped, the power consumption of the semiconductor chip may increase.

SUMMARY OF THE INVENTION

Exemplary embodiments of the present invention are directed to a 3D non-volatile memory device which is capable of simplifying a fabricating process and improving performance, and methods for operating and fabricating the same.

In accordance with an exemplary embodiment of the present invention, a 3D non-volatile memory device includes a plate-type lower select line formed over a substrate, a lower select transistor formed in the lower select line, a plurality of memory cells stacked over the lower select transistor, an upper select transistor formed over the memory cells, and a line-type common source line formed over the substrate and spaced from the lower select line.

In accordance with another exemplary embodiment of the present invention, there is provided a read method of a 3D non-volatile memory device including a plate-type lower select line formed over a substrate and having a first conductive type and a lower select transistor buried in the lower select line. The read method includes grounding a line-type common source line which is formed over the substrate so as to be spaced from the lower select line and has the first conductive type, grounding a well area which is formed in the substrate between the lower select transistor and the common source line and has a second conductive type different from the first conductive type, and activating the lower select line depending on a read operation of a corresponding string.

In accordance with yet another exemplary embodiment of the present invention, there is provided a program method of a 3D non-volatile memory device including a plate-type lower select line formed over a substrate and having a first conductive type and a lower select transistor buried in the lower select line. The program method includes grounding a line-type common source line which is formed over the substrate so as to be spaced from the lower select line and has the first conductive type, grounding a well area which is formed in the substrate between the lower select transistor and the common source line and has a second conductive type different from the first conductive type and deactivating the lower select line to isolate the common source line from a channel of the lower select transistor.

In accordance with still another exemplary embodiment of the present invention, there is provided an erase method of a 3D non-volatile memory device including a plate-type lower select line formed over a substrate and having a first conductive type, a lower select transistor buried in the lower select line, and a line-type common source line formed over the substrate and spaced from the lower select line. The erase method includes ramping a well area of a memory block performing an erase operation, where the well area is formed in the substrate between the lower select transistor and the common source line and has a second conductive type different from the first conductive type, floating a bit line, and floating an upper select line.

In accordance with still another exemplary embodiment of the present invention, a method for fabricating a 3D non-volatile memory device including a cell area and a peripheral circuit area includes forming a plate-type lower select line over a substrate forming a line-type common source line having a first conductive type over the substrate at a position spaced from the lower select line, and forming a lower select transistor buried in the lower select line.

DESCRIPTION OF SPECIFIC EMBODIMENTS

Figure 1:
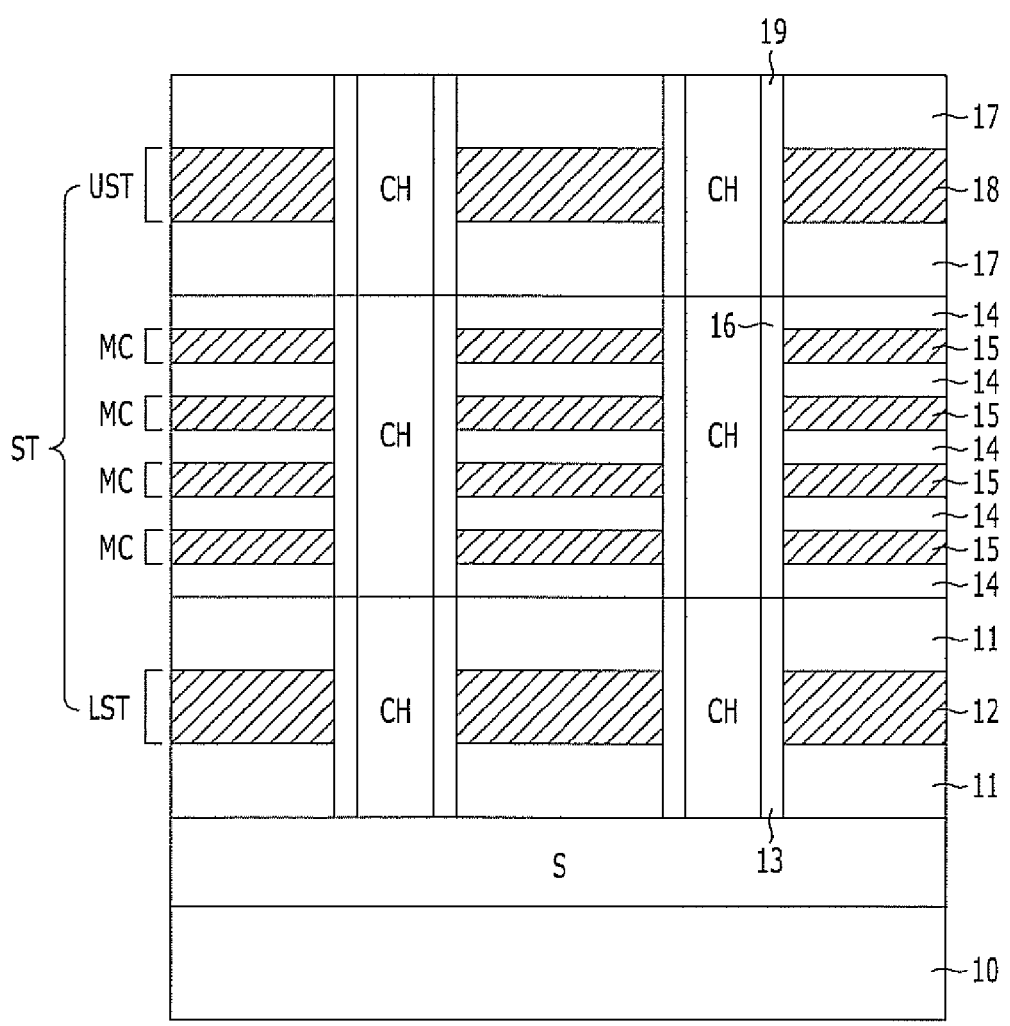
FIG. 1 is a cross-sectional view illustrating the structure of the conventional 3D non-volatile memory device and a method for fabricating the same.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2:
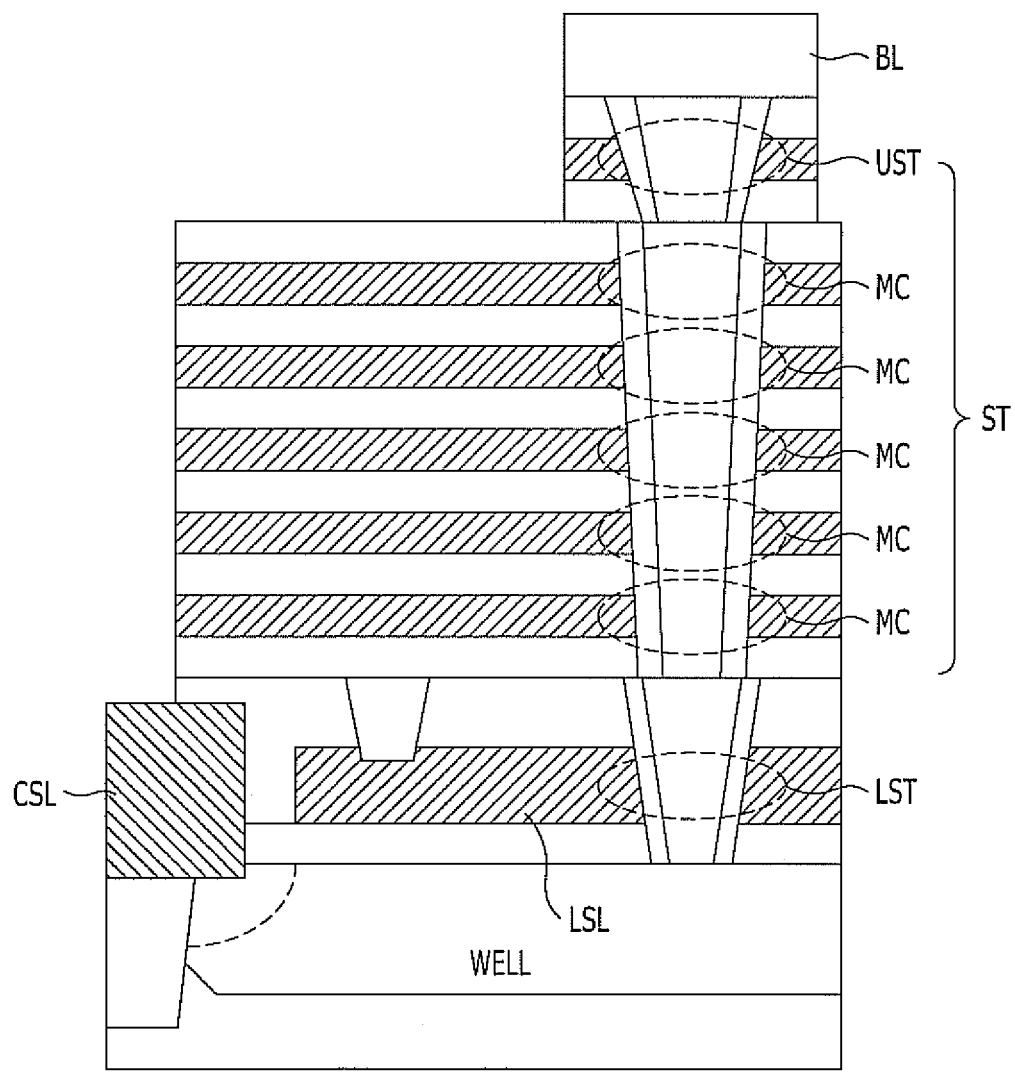
FIG. 2 is a cross-sectional view illustrating the structure of a 3D non-volatile memory device in accordance with an embodiment of the present invention.

FIG. 2 is a cross-sectional view of a 3D non-volatile memory device in accordance with an embodiment of the present invention. Referring to FIG. 2, core structures of the 3D non-volatile memory device is described. The structures of the 3D non-volatile memory device in accordance with the embodiment of the present invention are described in detail with reference to FIGS. 6A to 12.

Referring to FIG. 2, the 3D non-volatile memory device in accordance with the embodiment of the present invention includes a plate-type lower select line LSL formed on a substrate, a lower select transistor LST formed in the lower select line LSL, a plurality of memory cells MC stacked on the lower select transistor LST, and an upper select transistor UST formed on the memory cells MC. In particular, the lower select transistor LST, the plurality of memory cells MC, and the upper select transistor UST are stacked along a channel which passes through the lower select line LSL and projects/protrudes from the substrate.

The 3D non-volatile memory device further includes a line-type common source line CSL formed on the substrate and spaced from the lower select line LSL.

The lower select transistor LST, the plurality of memory cells MC, and the upper select transistor UST form one string ST, and a bit line BL is provided on the upper select transistor UST.

Inside the substrate between the lower select transistor LST and the command source line CSL, a well area WELL is provided. The channel of the lower select transistor LST and the command source line CSL may be a first conductive type, and the well area WELL may be a second conductive type. For example, the channel of the lower select transistor LST and the common source line CSL may be doped with N-type ion impurities, and the well area WELL may be doped with P-type ion impurities. As such, the common source line CSL and the channel of the lower select transistor LST are electrically isolated from each other by the well area WELL. When the 3D non-volatile memory device performs a predetermined operation, the channel of the lower select transistor LST and the common source line CSL are electrically connected by inverting the polarity of the well area WELL.

The common source line CSL, physically spaced from the lower select line LSL, is formed in a line shape on the substrate, while the source area is formed inside the substrate in the conventional 3D non-volatile memory device. As indicated by a dotted line in FIG. 2, ion impurities may be implanted into the substrate around the common source line CSL to overlap the common source line CSL and the lower select line LSL. For example, N-type ion impurities may be implanted into the substrate around the common source line CSL.

The lower select transistor LST includes a channel projecting from the substrate and passing trough the lower select line LSL and a gate dielectric layer interposed between the channel and the lower select line LSL, and is disposed in the lower select line LSL. The lower select transistor LST is a kind of source select transistor and serves as an electrical switch between the common source line CSL and the memory cells MC.

The plurality of memory cells MC serve to store data, and are disposed on a word line. The upper select transistor UST is a kind of drain select transistor, serves as an electrical switch between the word line and the bit line, and is disposed on an upper select line.

In accordance with the above-described structure, the plate-type lower select line LSL is formed on the substrate made of monocrystalline silicon, which can improve the on/off characteristics of the lower select transistor LST. Furthermore, it can easily control the threshold voltage of the lower select transistor LST. In particular, since the plate-type lower select line LSL is formed together when a transistor of a peripheral circuit area is formed, the fabricating process may be simplified to reduce the fabricating cost.

Furthermore, since the line-type common source line CSL is formed on the substrate while being spaced from the lower select line LSL, that is, the lower select transistor LST, the common source line CSL including a metal layer may be formed. Therefore, the resistance of the common source line CSL may be reduced to prevent an operation error during a read operation.

The channel of the lower select transistor LST, the channel of the plurality of memory cells MC, the channel of the upper select transistor UST, and the common source line CSL are doped with N-type ion impurities, and the well area WELL is doped with P-type ion impurities. Through this process, both of the common source line CSL serving as an N-type source and the well area WELL serving as a P-type source may be provided to increase the performance characteristics of an erase operation, compared with the conventional memory device.

In particular, an erase voltage may be applied to the P-type well area WELL to increase the speed of transferring the erase voltage, and a PN junction between the well area WELL and the channel may be formed to provide a sufficient amount of holes during the erase operation. Therefore, the speed of the erase operation of the memory device can be improved.

Figure 3A:
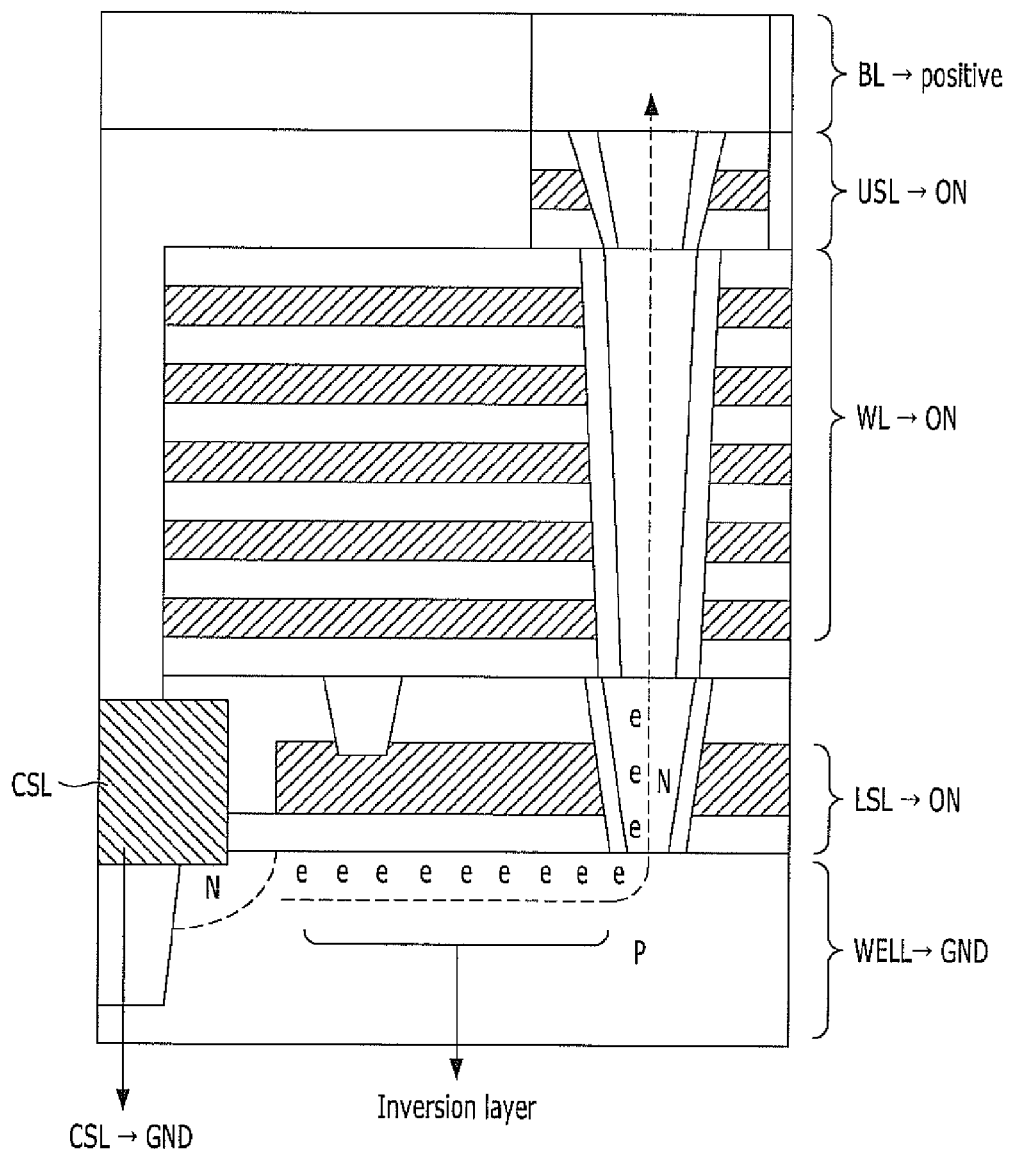
FIGS. 3A and 3B are cross-sectional views illustrating a read operation of the 3D non-volatile memory device in accordance with the embodiment of the present invention.
Figure 3B:
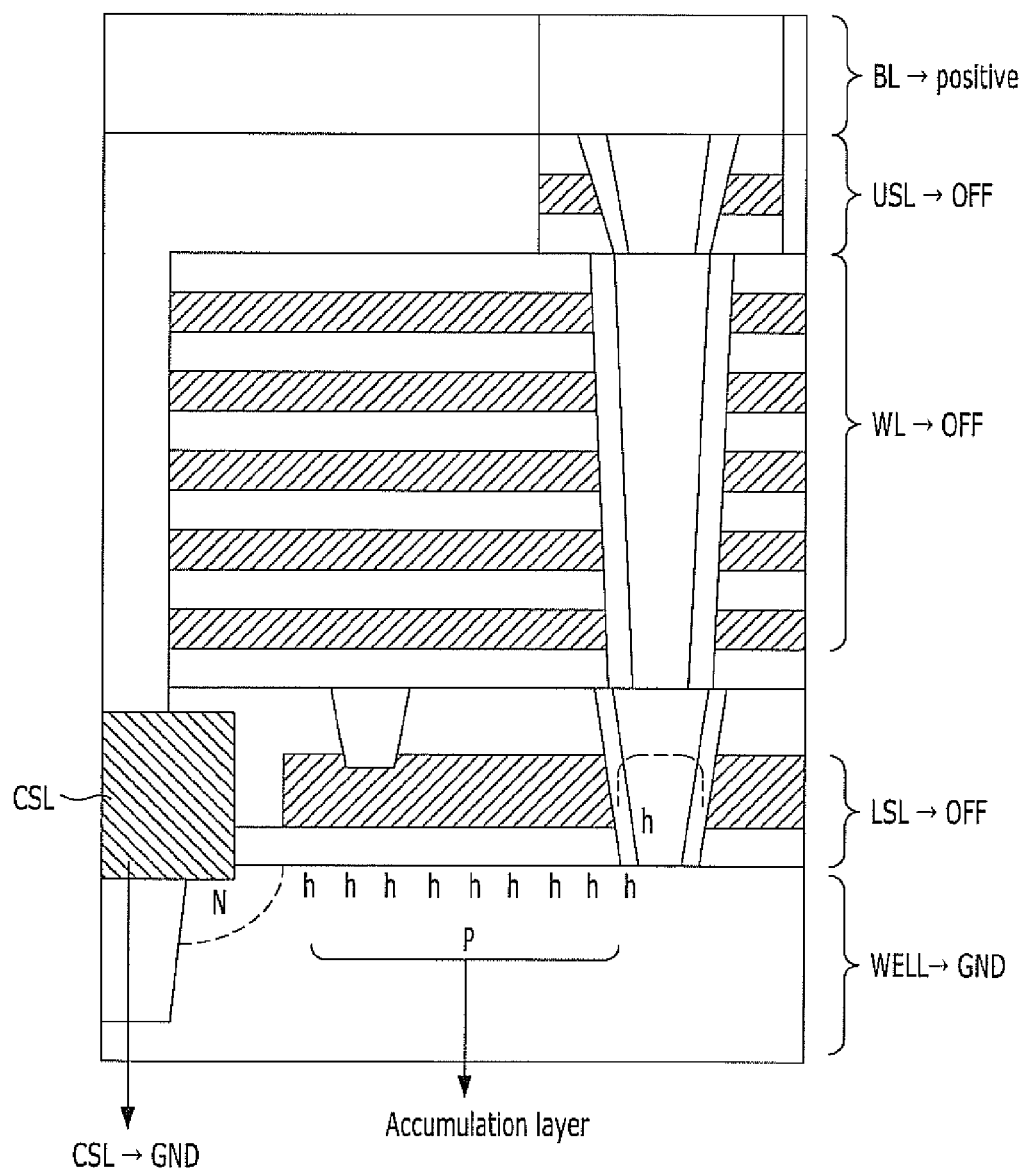

FIGS. 3A and 3B are cross-sectional views illustrating the read operation of the 3D non-volatile memory device in accordance with the embodiment of the present invention.

The non-volatile memory device performs the read operation by the unit of page. FIG. 3A illustrates an operation in a string of a memory block including a memory cell to perform the read operation, and FIG. 3B illustrates an operation in the other strings of the memory block.

Referring to FIGS. 3A and 3B, the common source line CSL and the well area WELL of the memory block to perform the read operation are grounded, and a positive voltage is applied to the bit line BL. For example, an operating voltage Vcc may be applied to the bit line BL.

In the case of the string including the memory cell to perform the read operation (FIG. 3A), the lower select line LSL is turned on. That is, a turn-on voltage is applied to the lower select line LSL to invert the polarity in the upper part of the well area WELL such that an inversion layer is formed. Then, the common source line CSL is connected to the channel of the lower select transistor LST through the inversion layer. In this case, a voltage of 0 to 6V may be applied to the lower select line LSL.

Furthermore, a sensing voltage is applied to the word line WL connected to the memory cell to perform the read operation, and a turn-on voltage is applied to the other word lines WL. The upper select line USL is turned on to electrically connect the word line WL and the bit line BL. For example, a voltage of 0 to 6V may be applied to the upper select line USL. Through this process, data stored in the memory cell may be read.

In the case of the string without the memory cell to perform the read operation (FIG. 3B), the lower select line LSL and the upper select line USL are turned off, e.g. being supplied with a turn-off voltage or being at a floating state. At this time, since the common source line LSL and the channel of the lower select transistor LST are isolated by the well area WELL having a different conductive type, it can prevent charges from moving to the bit line BL from the common source line CSL.

As a matter of course, one memory block includes a plurality of strings. Therefore, in order to perform the read operation in one string of the memory block, other strings which belong to the same memory block even without the memory cell to perform the read operation may have the lower select line USL turned on. In this case, although the inversion layer is formed in the upper part of the well area WELL, it can prevent charges from moving to the bit line BL from the common source line CSL, because the upper select line USL is turned off.

Figure 4A:
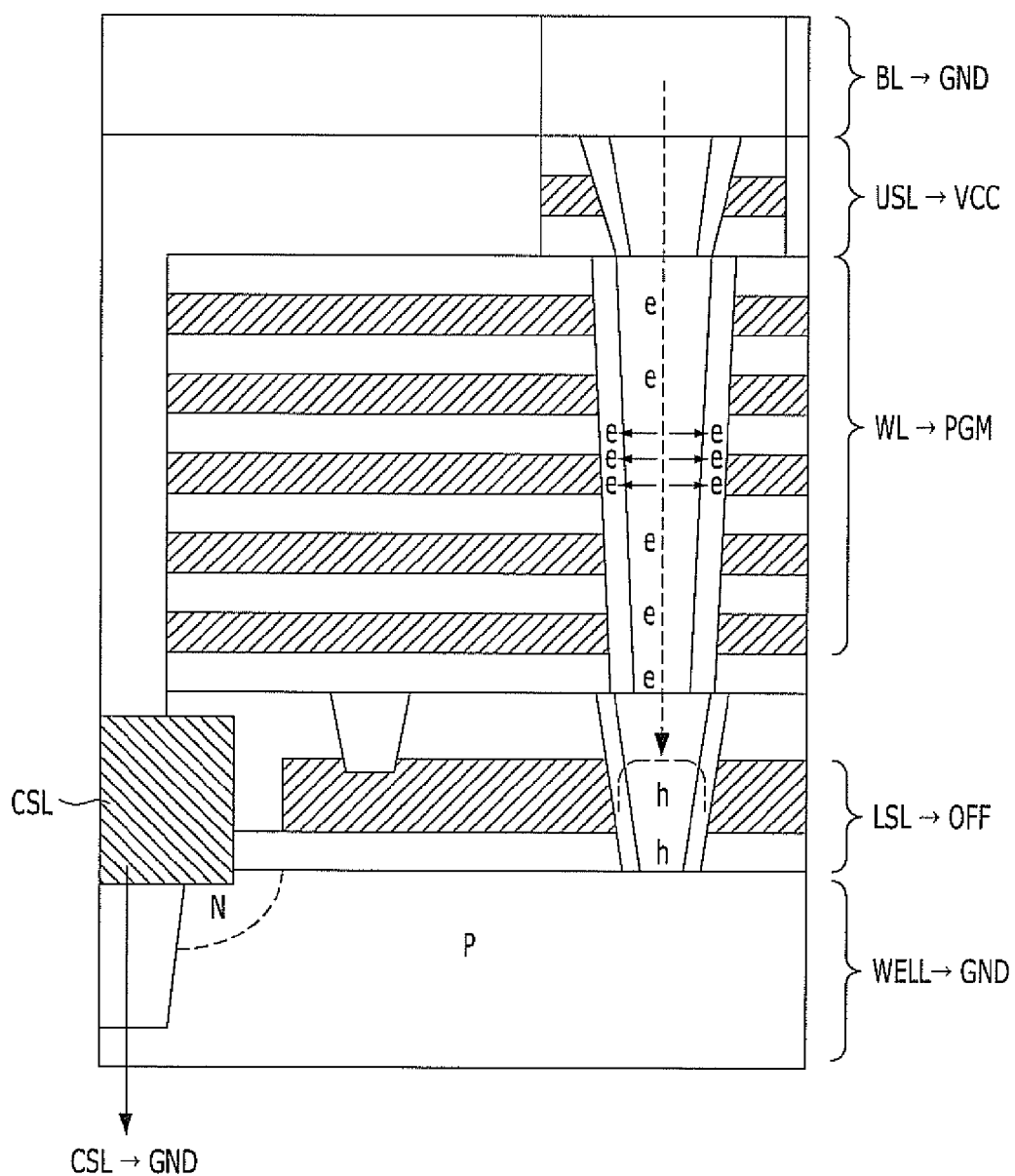
FIGS. 4A and 4B are cross-sectional views illustrating a program operation of the 3D non-volatile memory device in accordance with the embodiment of the present invention.
Figure 4B:
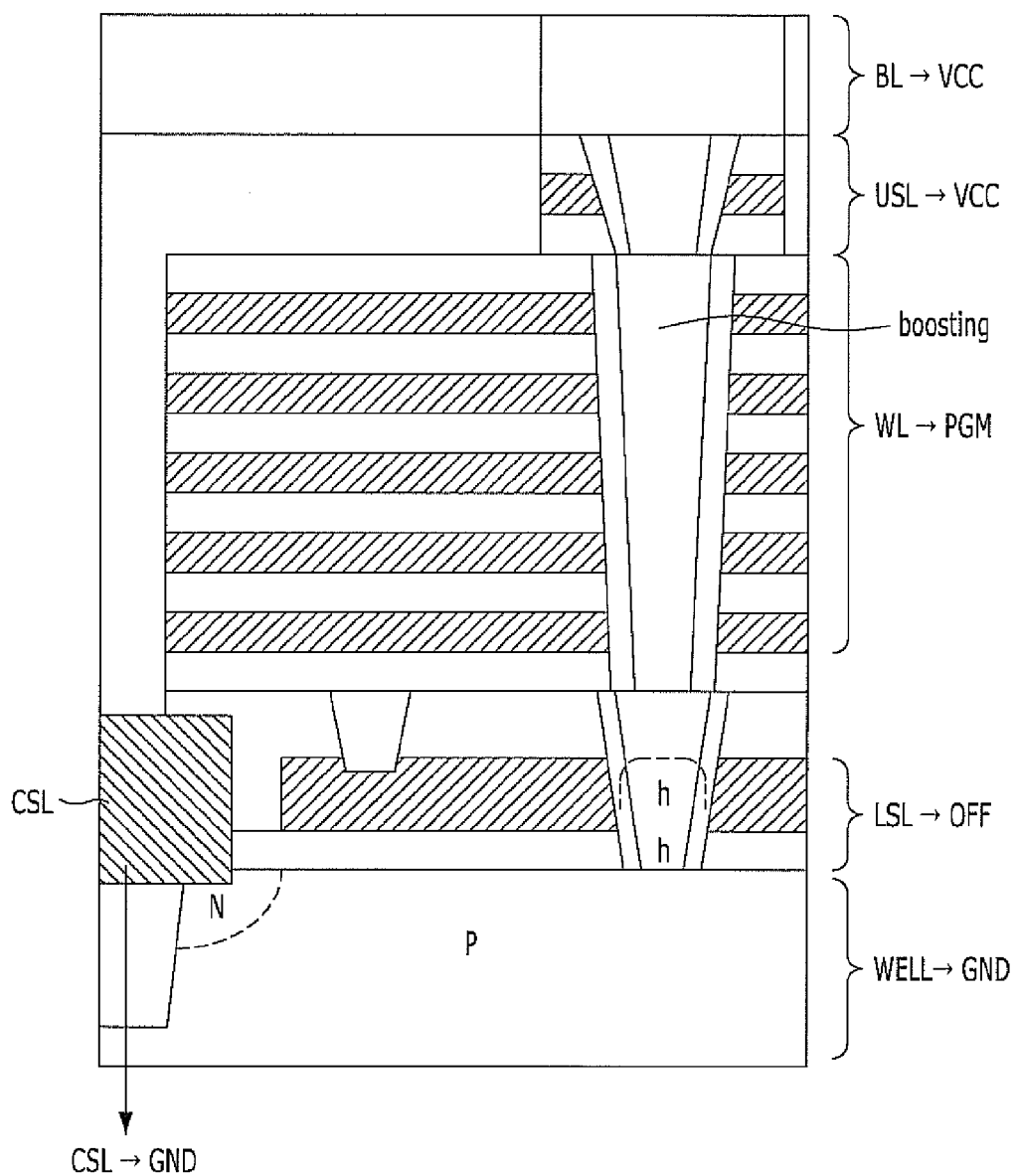

FIGS. 4A and 4B are cross-sectional views illustrating a program operation of the 3D non-volatile memory device in accordance with the embodiment of the present invention.

The 3D non-volatile memory device performs a program operation by the unit of page. FIG. 4A illustrates an operation in a string including a memory cell to perform the program operation, and FIG. 4B illustrates an operation in other strings.

Referring to FIGS. 4A and 4B, the common source line CLS and the well area WELL of the memory block to perform the program operation are grounded. To electrically isolate a plurality of strings included in the memory block, the lower select line LSL is turned off.

In the case of the string including the memory cell to perform the program operation (FIG. 4A), the bit line BL is grounded, and an operating voltage Vcc is applied to turn on the upper select line USL. Then, a ground voltage is transferred to the channel of the memory cell. Furthermore, a program voltage is applied to the word line WL connected to the memory cell to perform the program operation such that charges are injected into a charge capture layer of the memory cell by Fowler-Nordheim tunneling phenomenon. For example, a voltage of 8 to 20V is applied to the word line WL, i.e., a program word line, and a voltage of 6 to 10V is applied to other word lines WL, i.e., pass word lines.

In the case of the string without the memory cell to perform the program operation (FIG. 4B), an operating voltage Vcc is applied to the bit line BL and the upper select line USL to boost the channel of the memory cell, which can prevent the memory cell from being programmed.

Figure 5A:
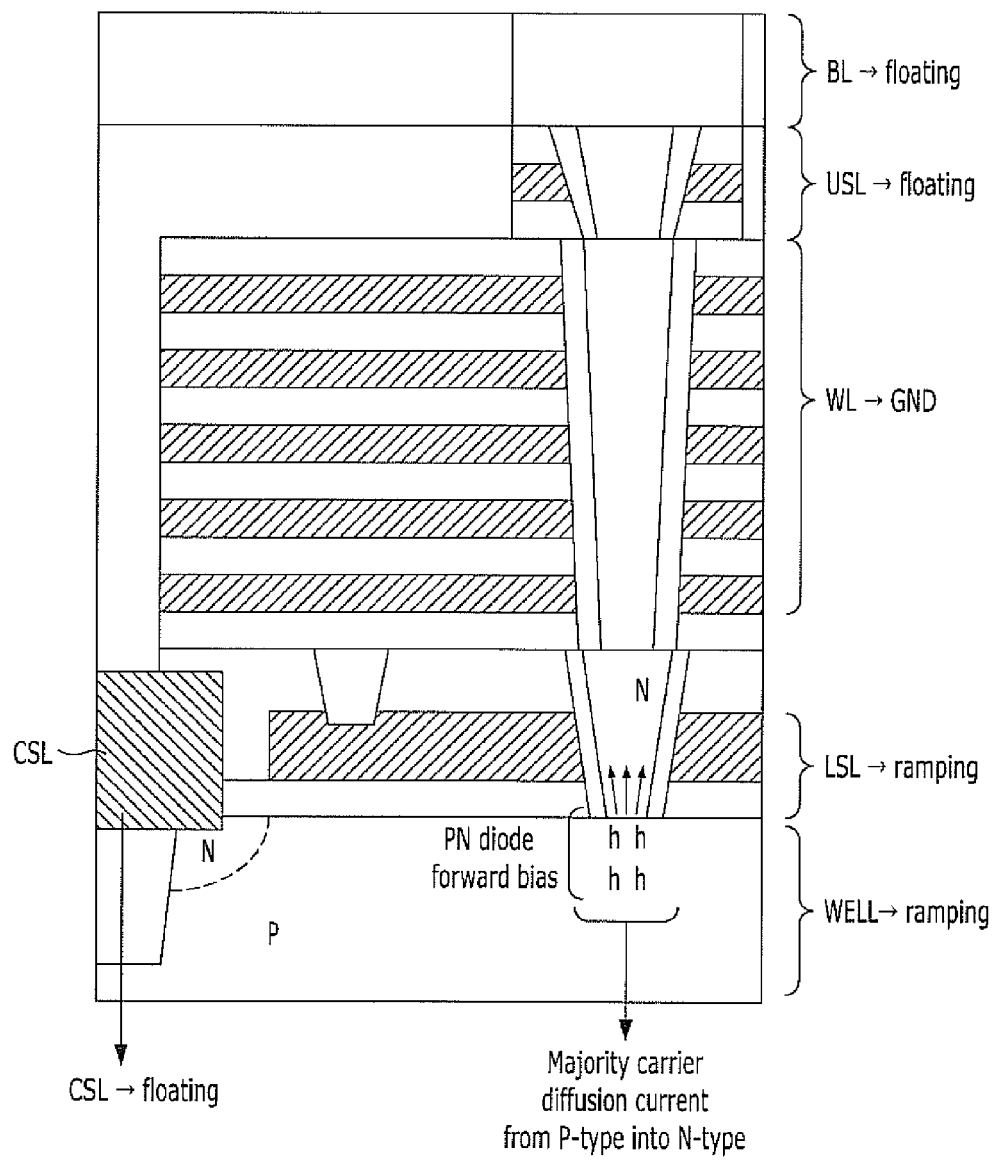
FIGS. 5A and 5B are cross-sectional view illustrating an erase operation of the 3D non-volatile memory device in accordance with the embodiment of the present invention.
Figure 5B:
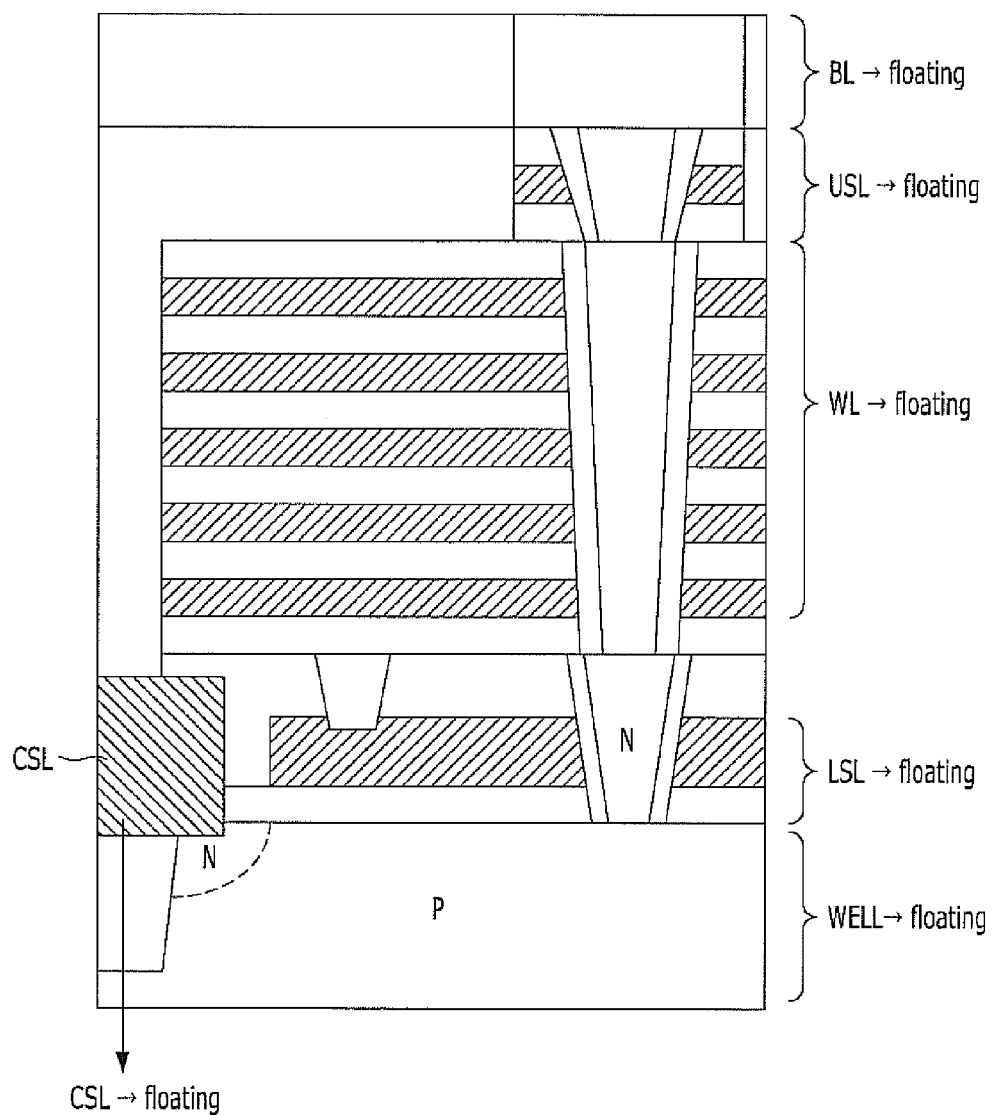
Figure 5C:
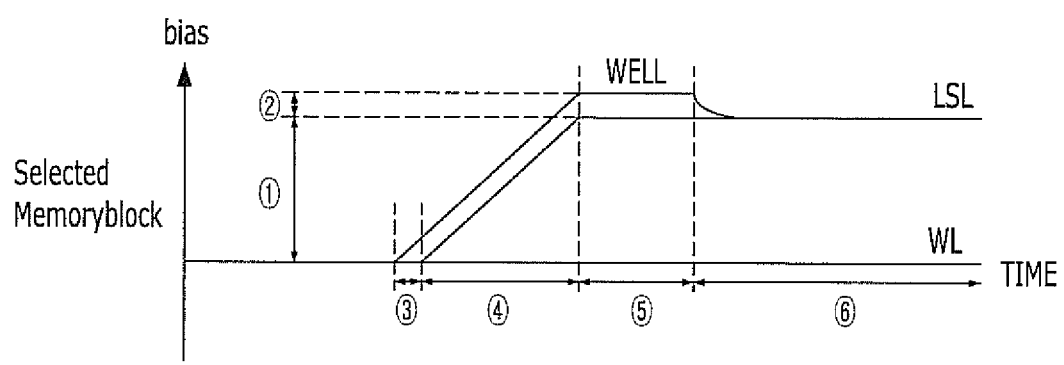
FIG. 5C is a timing diagram illustrating the operation of a memory block in which the erase operation is performed in accordance with the embodiment of the present invention.

FIGS. 5A and 5B are cross-sectional view illustrating an erase operation of the 3D non-volatile memory device in accordance with the embodiment of the present invention. FIG. 5C is a timing diagram illustrating the operation of a memory block in which the erase operation is performed in accordance with the embodiment of the present invention.

The 3D non-volatile memory device performs the erase operation by the unit of memory block. FIG. 5A illustrates an operation in a memory block to perform the erase operation, and FIG. 5B illustrates an operation in other memory blocks.

In the case of the memory block to perform the erase operation (FIG. 5A), the common source line CLS is floated. The word line WL is grounded, and an erase voltage is applied to the well area WELL to ramp the well area WELL. Then, the erase voltage applied to the well area WELL is transferred to the channel of the memory cell by ramping the lower select line LSL with a certain time difference provided.

At this time, since a positive erase voltage is applied to the well area WELL serving as a P-type source, the erase voltage is quickly transferred to the channel of the memory cell. Furthermore, since the well area WELL is ramped to a higher level than the lower select line LSL, a forward bias is applied to the P-N junction formed between the well area WELL and the channel of the lower select transistor LST. Accordingly, holes as majority carriers diffuse from the P-type well area WELL to the N-type channel. Therefore, a sufficient amount of holes can be supplied for the erase operation.

Accordingly, the bit line BL and the upper select line USL do not need to be ramped. During the erase operation, the bit line BL and the upper select line USL are floated. Through this process, the power consumption of the semiconductor chip can be reduced.

Referring to FIG. 5C, the erase operation is described in more detail. FIG. 5C is a timing diagram showing the operation of the memory block which is selected to perform the erase operation.

First, the well area WELL is ramped to a voltage of 8V to 26V. That is, a voltage of 8 to 26V is applied to the well area WELL. After 0 to 500 us (③) passes since the well area WELL was ramped, the lower select line LSL is ramped. The period (④) during which the well area WELL and the lower select line LSL are ramped together may range from 0 to 1 ms.

At this time, the well area WELL may be ramped to be higher than the lower select line LSL. For example, the lower select line LSL may be ramped to a voltage of 8 to 25V (①), and the well area WELL may be ramped to a higher level by a voltage of 0 to 1V (②) than the lower select line LSL.

The ramping states of the well area WELL and the lower select line LSL are maintained for a certain period (⑤+⑥). During the initial period (⑤), a higher level of erase voltage is applied to the well area WELL, as in the ramping period (④). The corresponding period (⑤) may range from 0 ms to 5 ms. As such, a higher level of erase voltage may be applied to the well area WELL to effectively generate holes to be injected to the charge capture layer. During the late period (⑥), an erase voltage having the same level of 8 to 25V (①) is applied to the well area WELL and the lower select line LSL. The corresponding period (⑥) may range from 0 ms to 5 ms.

When the erase operation is performed in such a manner, the common source line CSL, the bit line BL, and the upper select line USL maintain the floating state as described above.

In the case of the memory blocks other than the one performing the erase operation (5B), the well area WELL, the common source line CSL, the bit line BL, the upper select line USL, the lower select line LSL, and the word line WL are floated.

Since the memory blocks share the bit line BL with the one performing the erase operation, the operations of the upper select line USL and the word line WL may be determined depending on the operation of the bit line BL.

In the conventional memory device, the bit line BL is ramped to forcibly generate the GIDL current during the erase operation. Accordingly, when a high level of bias is applied to an oxide layer of the upper select transistor, the reliability of the upper select transistor may be reduced. To prevent the reduction in the reliability, the upper select line USL is ramped together. Therefore, the power consumption of the memory device increases.

In accordance with the embodiment of the present invention, however, since the bit line BL is floated during the erase operation as described above, the reliability of the upper select transistor can be secured. Therefore, the upper select line USL does not need to be ramped. That is, the upper select line USL is floated. Accordingly, the word line WL and the lower select line LSL are floated, which can reduce the power consumption of the memory device.

As a result, the erase operation may be performed effectively compared to the conventional non-volatile memory device.

FIGS. 6A to 12 are diagrams illustrating a method for fabricating a 3D non-volatile memory device in accordance with another embodiment of the present invention. The drawings designated by the same number illustrate the same step in the fabricating process. Among the same number of drawings, the drawing A illustrates the cross-section of a cell area, the drawing B illustrates the cross-section of a peripheral circuit area, and the drawing C illustrates a plan view of the cell area at the corresponding step. In particular, the drawing A represents the cross-section taken along a line A-A' of the drawing C. In the step of the drawings 11 and 12, the cross-section of a cell area is illustrated.

Figure 6A:
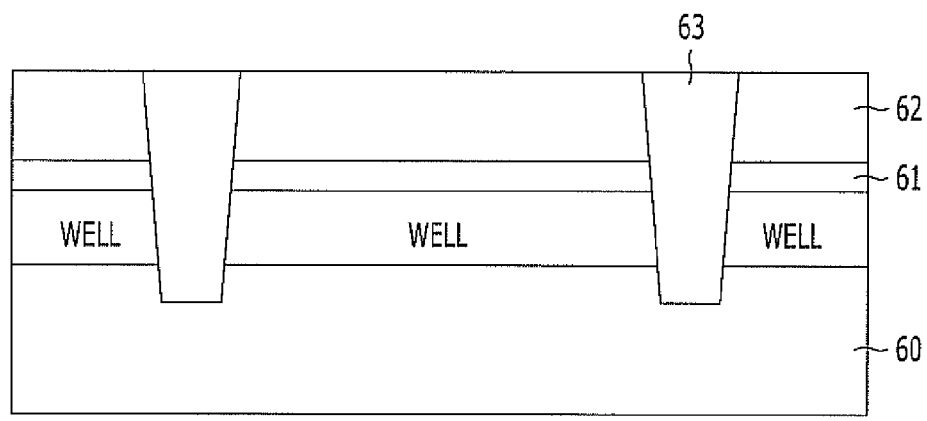
FIGS. 6A to 12 are diagrams illustrating a method for fabricating a 3D non-volatile memory device in accordance with another embodiment of the present invention.
Figure 6B:
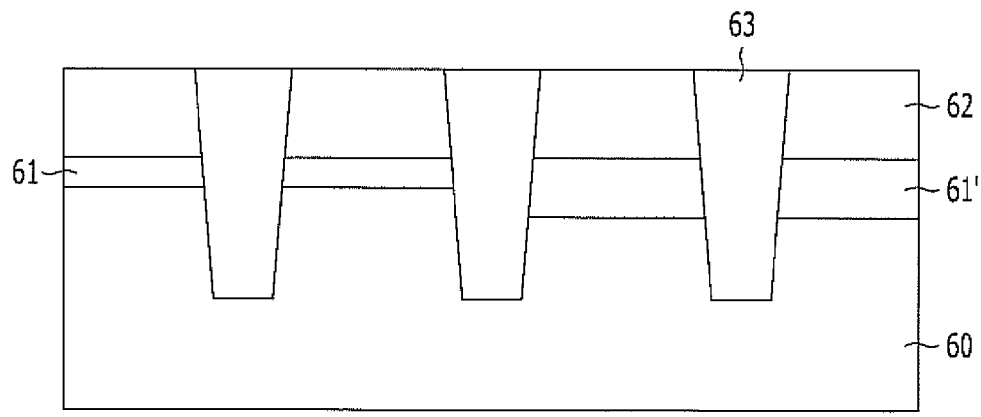
Figure 6C:
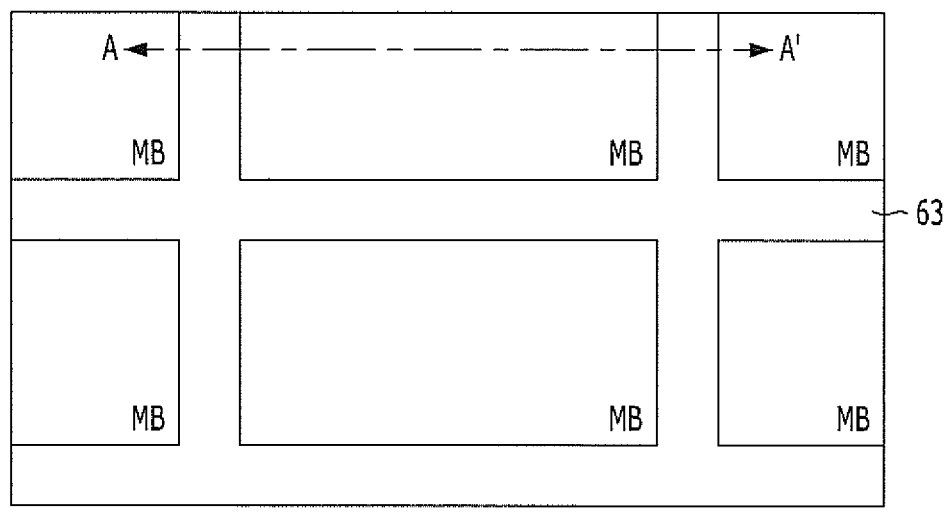

Referring to FIGS. 6A to 6C, a substrate 60 including a cell area and a peripheral circuit area is provided, and a well area WELL is formed by implanting ion impurities having a second conductive type into the cell area of the substrate 60. The second conductive type may be a P-type.

A gate dielectric layer 61 and a hard mask layer 62 are formed on the substrate 60. The hard mask layer 62, the gate dielectric layer 61, and the substrate 60 are etched to a certain depth to form a device isolation trench. The hard mask layer 62 may include a nitride layer.

An insulation layer is buried in the device isolation trench to form a device isolation layer 63 in the cell area and the peripheral circuit area. In the cell area, an area for a plurality of memory blocks MB is defined by the device isolation layer.

Figure 7A:
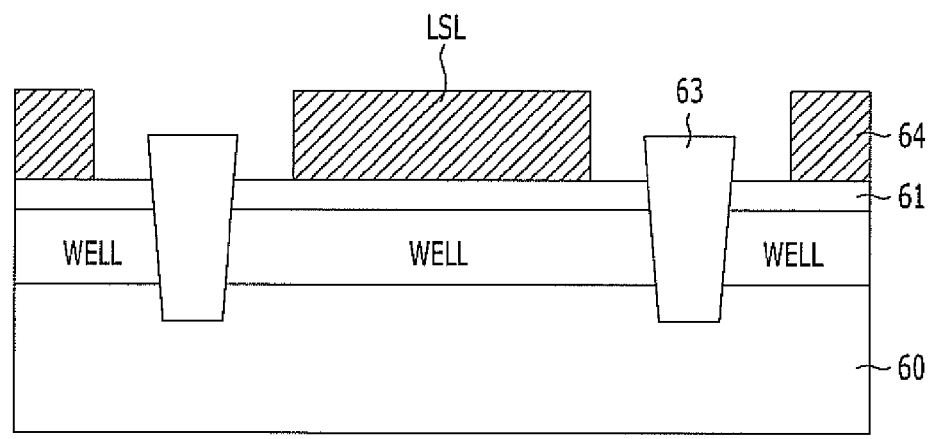
Figure 7B:
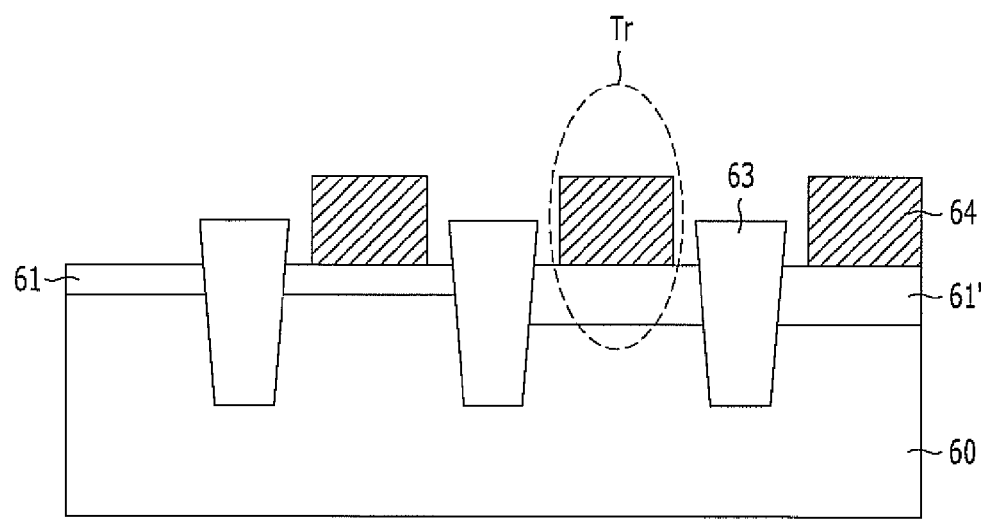
Figure 7C:
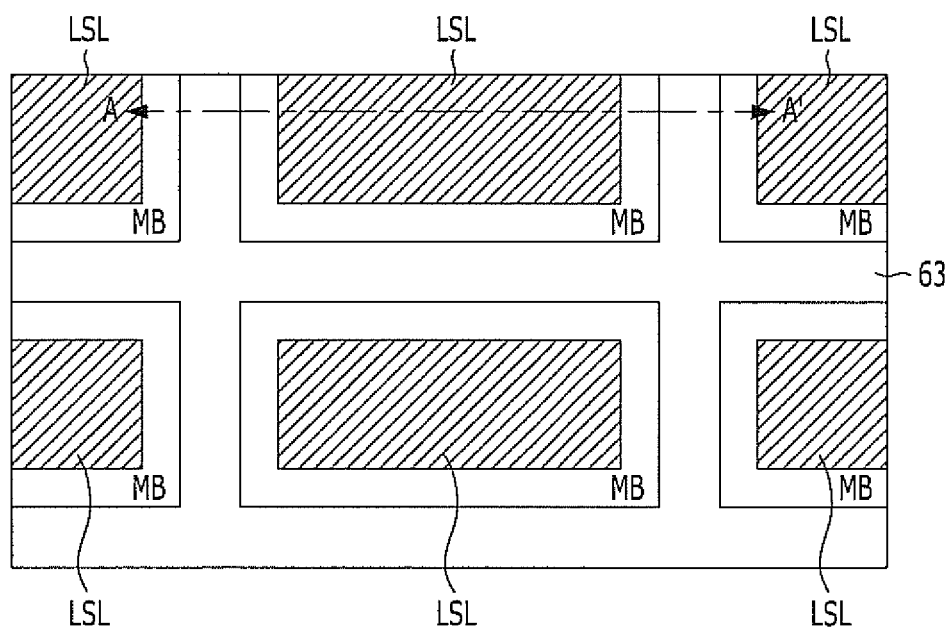

Referring to FIGS. 7A to 7C, the hard mask layer 62 is removed, and a conductive layer 64 is formed on the entire surface of the resultant structure. The conductive layer 64 is patterned to form a plate-type lower select line LSL in the cell area. Simultaneously, a transistor Tr for driving the memory device is formed in the peripheral circuit area.

In particular, since the plate-type lower select line LSL is formed in each of the memory blocks MB, a plurality of strings ST belonging to the same memory block MB shares the same lower select line LSL.

Figure 8A:
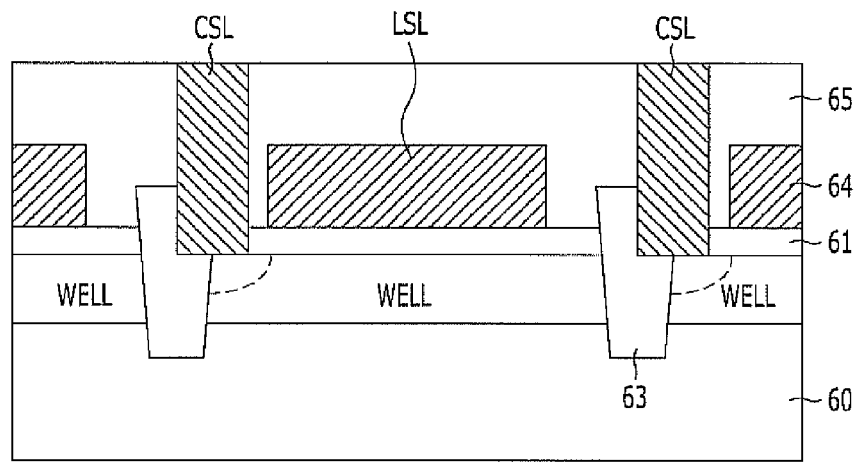
Figure 8B:
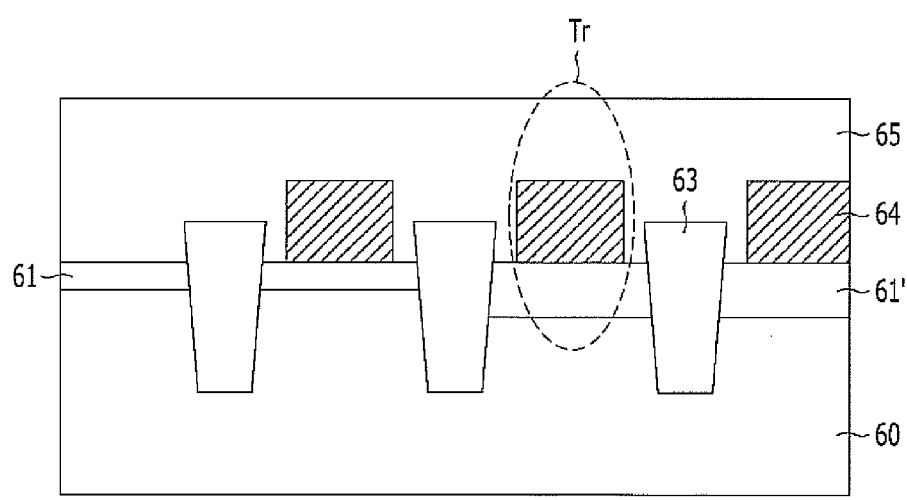
Figure 8C:
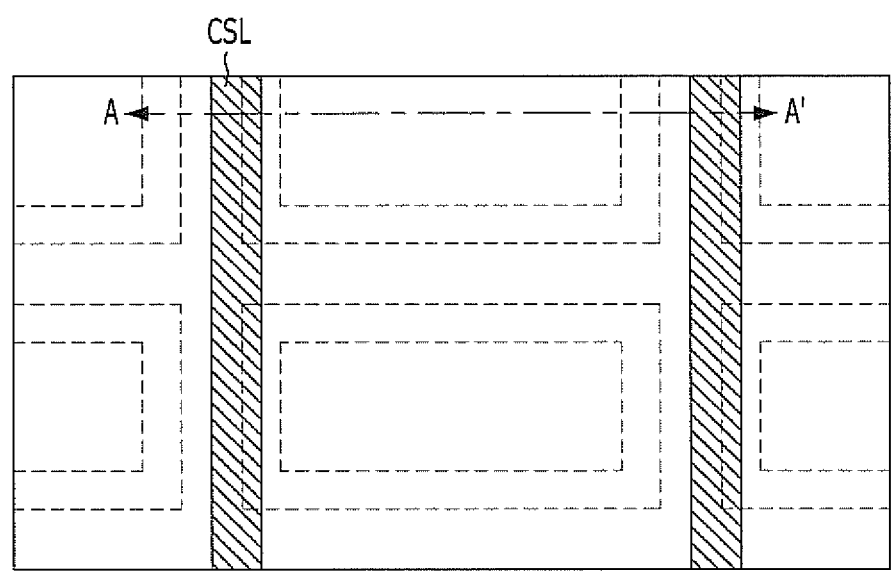

Referring to FIGS. 8A to 8C, an interlayer dielectric layer 65 is formed on the resultant structure having the lower select lien LSL formed therein. At least the interlayer dielectric layer 65 is etched to form a common source line trench exposing the surface of the substrate 60.

At this time, the common source line trench is formed in each of the memory blocks MB, and has a line shape extending in parallel to a predetermined direction. Furthermore, the common source line trench is formed so as to be spaced from the lower select line LSL. During the etching process for forming the common source line trench, the device isolation layer 63 may be partially etched to increase the width of the common source line trench. Through this process, it can increase the width of a common source line which is to be formed in a subsequent process.

Ion impurities are implanted into the substrate 60 exposed at the bottom surface of the common source line trench. At this time, ion impurities having a first conductive type which is the same as that of the common source line to be formed in a subsequent process may be implanted. For example, N-type ion impurities may be implanted. Through this process, the contact resistance between the substrate 60 and the common source line to be formed in a subsequent process may be reduced, and the common source line CSL and the lower select line LSL may be overlapped.

A conductive layer is buried into the common source line trench to form the common source line CSL extending in parallel to the predetermined direction. Here, the common source line CSL is formed on the substrate so as to be spaced from the lower select line LSL, and may include a metallic layer. Since the common source line CSL includes a metallic layer, the resistance of the common source line CSL may be reduced.

The common source line CSL may be doped with ion impurities having the first conductive type. For example, N-type ion impurities may be doped. Furthermore, while the process for forming the common source line CLS is performed in the cell area, the peripheral circuit area may be covered with photoresist.

Figure 9A:
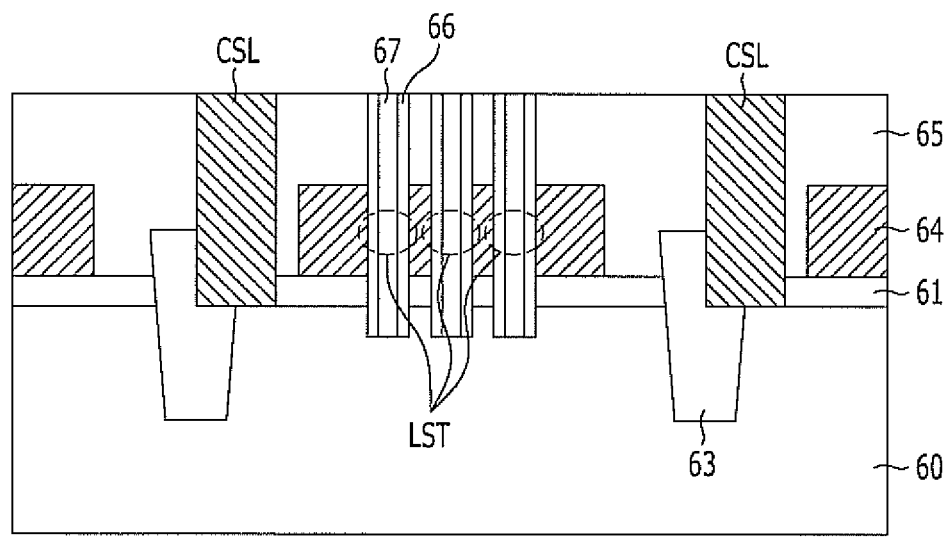
Figure 9B:
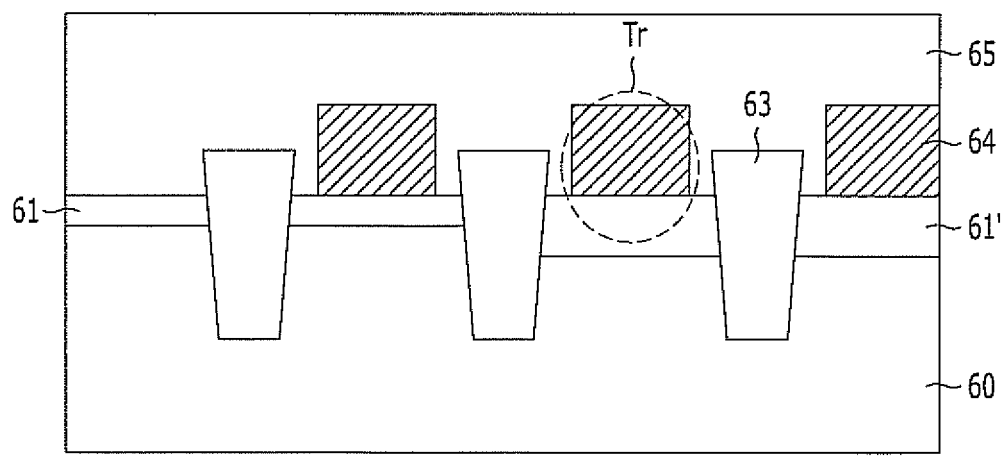
Figure 9C:
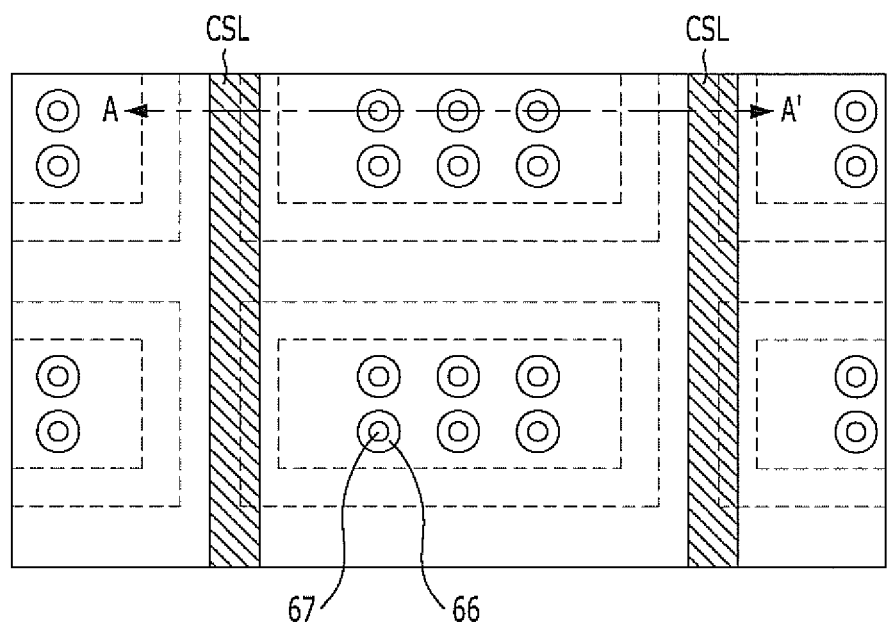

Referring to FIGS. 9A to 9C, the interlayer dielectric layer 65 and the lower select line LSL are etched to form a plurality of trenches exposing the surface of the substrate 60. A gate dielectric layer 66 is formed on the inner walls of the trenches, and a channel layer is buried into the trenches having the gate dielectric layer 66 formed therein to form a plurality of channels 67. The channels 67 may be doped with ion impurities having the first conductive type which is the same as that of the common source line CSL. In particular, N-type ion impurities may be doped.

Accordingly, the lower select transistors LST including the channels passing through the lower select line LSL and the gate dielectric layer 66 interposed between the channels and the lower select line LSL are formed.

FIG. 9C illustrates an embodiment in which six lower select transistors LST are formed in one memory block MB, but the present invention is not limited thereto. Depending on the integration degree of the memory device, the number of strings included in one memory block may be determined.

Figure 10A:
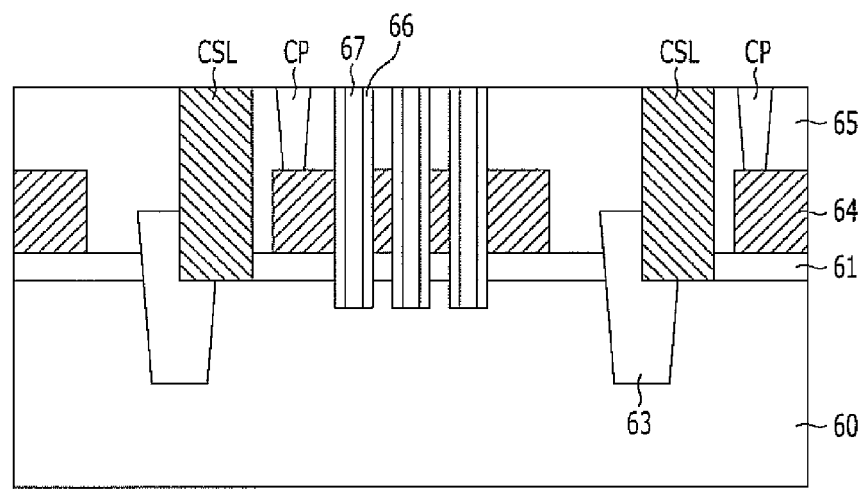
Figure 10B:
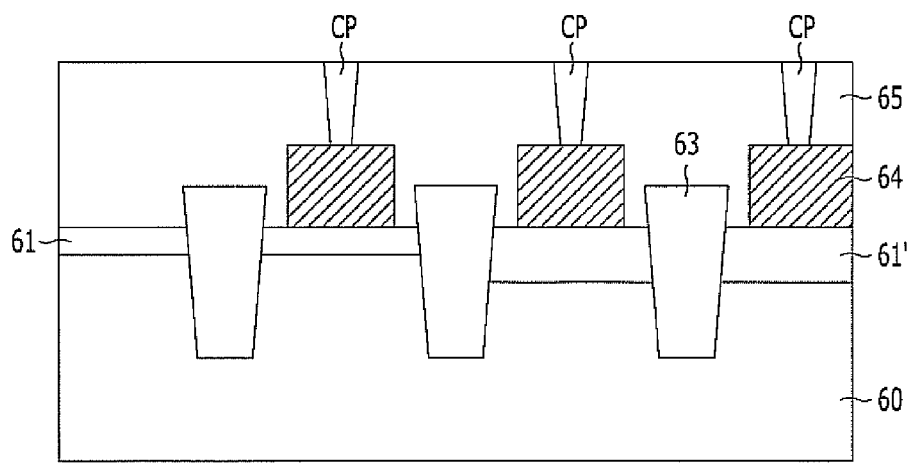
Figure 10C:
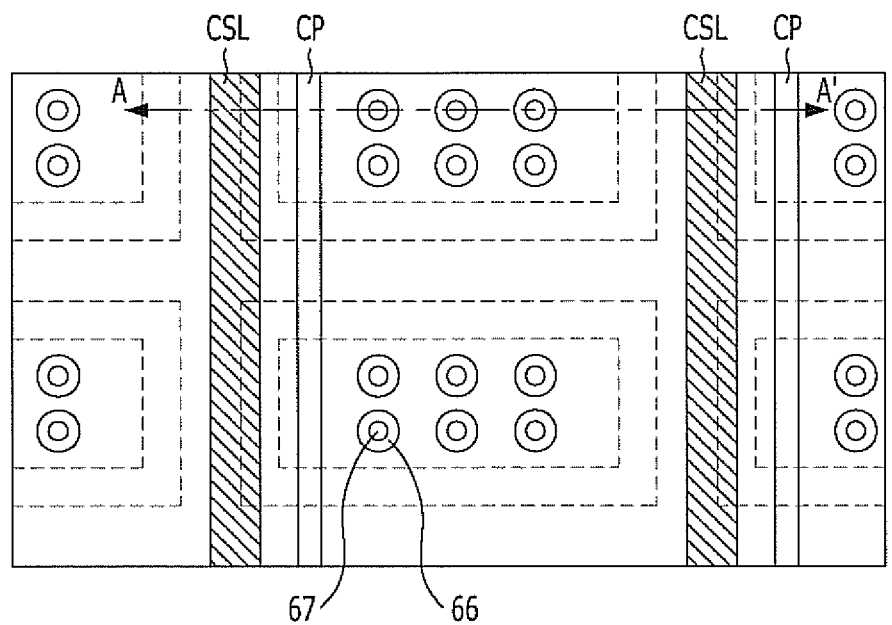

Referring to FIGS. 10A to 10C, the interlayer dielectric layer 65 is etched to form a contact hole exposing the surface of the lower select line LSL, and a conductive layer is buried into the contact hole to form a contact plug CP connected to the lower select line LSL.

The contact plug CP serves to apply an input voltage to the lower select line LSL. A plurality of line-type contact plugs CP may be formed between the common source line CSL and the lower select transistor LST so as to extend in parallel to the predetermined direction. Furthermore, the process for forming the contact plug CP in the cell area may be performed together during a process for forming a contact plug CP of the transistor Tr formed in the peripheral circuit area.

Figure 11:
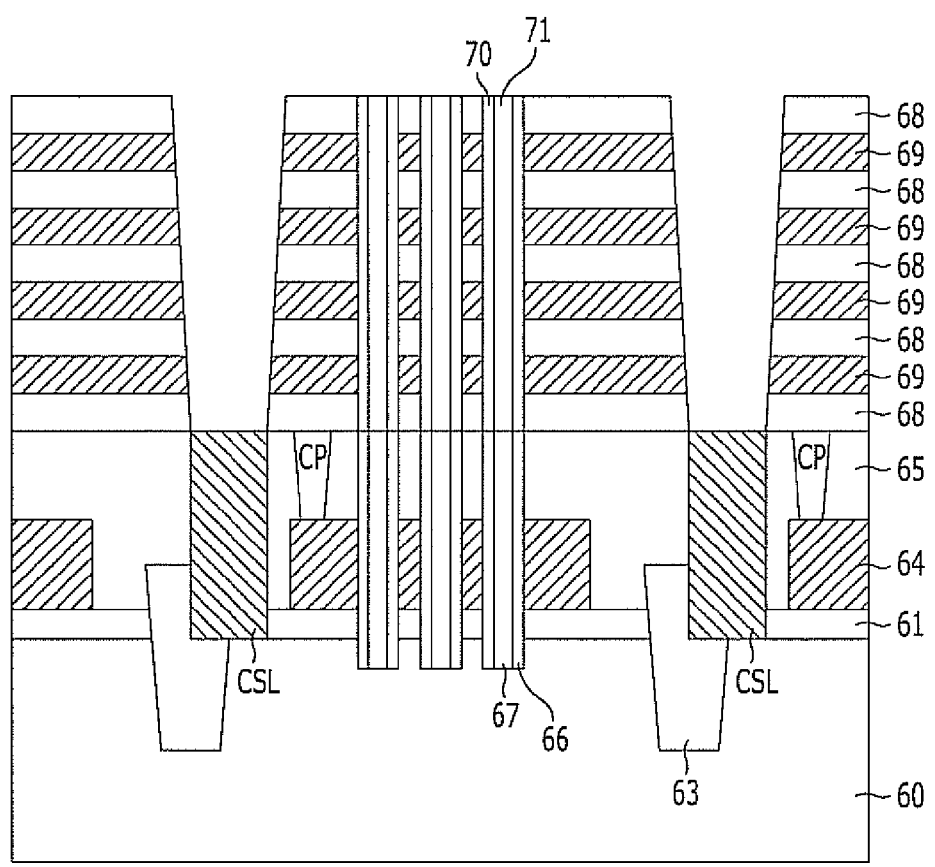

Referring to FIG. 11, the a plurality of first and second material layers 68 and 69 for forming memory cells are alternately formed on the resultant structure having the lower select transistor LST and the common source line CSL formed therein.

The first and second material layers 68 and 69 may be formed of various materials depending on the method for forming the memory cells. Hereafter, the methods for forming the memory cells depending on the types of the first and second material layers 68 and 69 are described in detail.

First, a case in which the first material layer 68 is an interlayer dielectric layer and the second material layer 69 is a conductive layer is described.

The plurality of first and second material layers 68 and 69 are etched to form a plurality of trenches exposing the channels 67 of the lower select transistors LST. A charge blocking layer, a charge trap layer, and a tunnel insulating layer are sequentially formed on the inner walls of the trenches, and a channel layer is buried into the trenches to form a plurality of channels 71. For convenience of description, the charge blocking layer, the charge trap layer, and the tunnel insulating layer are illustrated as one layer represented by reference numeral 70. The channels 71 may be doped with ion impurities having the first conductive type, for example, N-type impurities. Accordingly, a plurality of memory cells are formed so as to be stacked along the channels projecting from the substrate 60.

Second, a case in which the first material layer 68 is an interlayer dielectric layer and the second material layer 69 is a sacrifice layer is described.

The plurality of first and second material layers 68 and 69 are etched to form a plurality of trenches exposing the channels 67 of the lower select transistors LST, and a channel layer is buried into the trenches to form a plurality of channels projecting from the substrate. The channels may be doped with ion impurities having the first conductive type, for example, N-type impurities.

In a state in which the first material layers 68 remain, only the second material layers 69 are selectively removed to expose the sidewalls of the channels by a certain interval. A charge blocking layer, a charge trap layer, and a tunnel insulating layer are sequentially formed on the sidewall walls of the exposed channels, and a conductive layer is formed on the charge blocking layer. Accordingly, a plurality of memory cells are formed so as to be stacked along the channels projecting from the substrate.

FIG. 11 illustrates the case in which the plurality of memory cells are formed by the method in accordance with the first embodiment.

Figure 12:
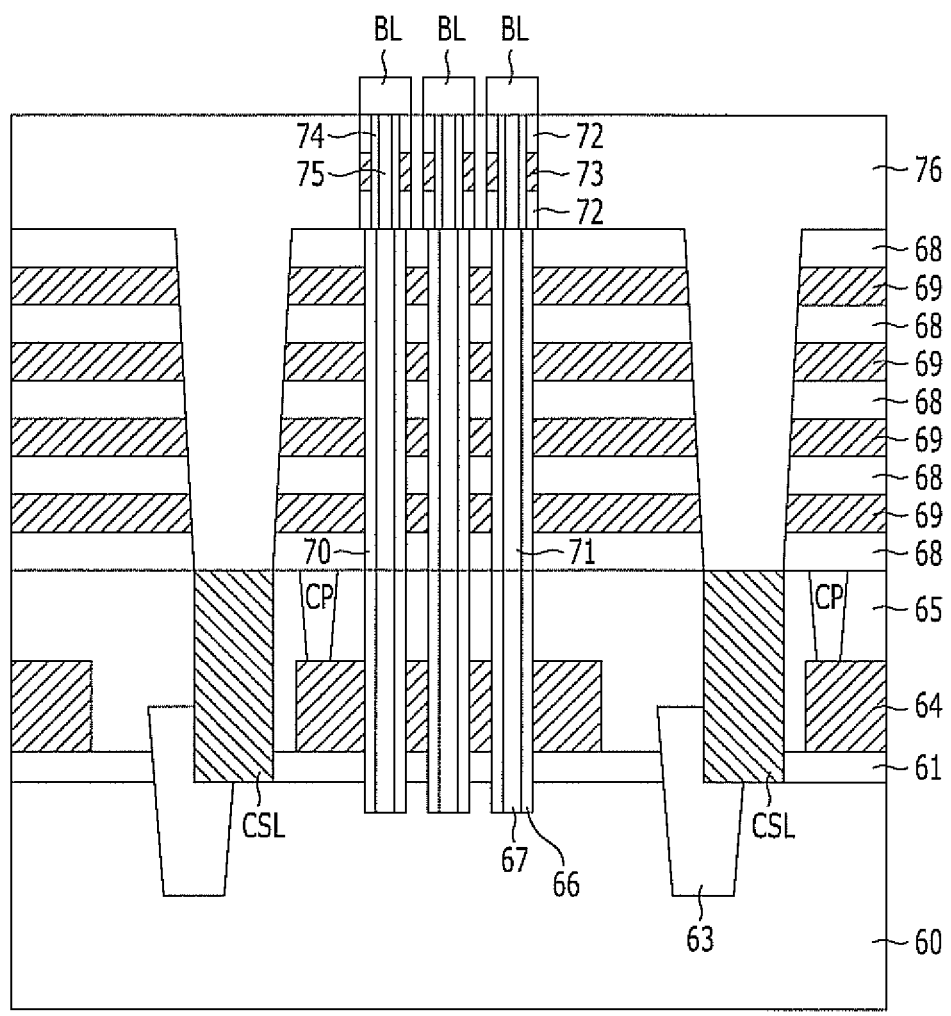

Referring to FIG. 12, the plurality of first and second material layers 68 and 69 are etched to isolate the plurality of memory blocks MB from each other. At this time, the etching process may be performed until the surface of the common source line CSL is exposed.

On the resultant structure having the plurality of memory cells formed therein, an interlayer dielectric layer 72 and a conductive layer 73 for forming an upper select line USL are formed. The interlayer dielectric layer 72 and the conductive layer 73 are etched to form a plurality of trenches exposing the surfaces of the channels 71 of the memory cells. A gate dielectric layer 74 is formed on the inner walls of the trenches, and a channel layer is buried into the trenches to form a plurality of channels 75 of the upper select transistor UST.

The interlayer dielectric layer 72 and the conductive layer 73 are etched to form a plurality of upper select lines USL extending in parallel to the predetermined direction, and an interlayer dielectric layer 76 is formed on the entire resultant structure. A plurality of bit lines BL are formed on the upper select lines USL.

Although not illustrated in FIG. 12, a process for forming a contact plug connected to the common source line CSL formed on the substrate 60 is performed.

In accordance with the exemplary embodiments of the present invention, the lower select line of the cell area and the transistor of the peripheral circuit area are simultaneously formed, which can simplify the fabricating process of the memory device. Furthermore, the step level difference between the peripheral circuit area and the cell area may be minimized.

Since the plate-type lower select line is formed on the substrate, the channel of the lower select line is formed of monocrystalline silicon. Therefore, the on/off characteristics of the lower select line (transistor) are improved, and the threshold voltage is easily controlled. Furthermore, since the common source line including a metallic layer is formed on the substrate, the resistance of the common source line may be reduced to minimize/reduce an occurrence of an error during the read operation.

In particular, the channel of the lower select transistor and the common source line are formed to have the first conductive type, and the well area having the second conductive type is formed in the substrate between the channel of the lower select transistor and the common source line. Therefore, during the operation of the memory device, the channel and the common source line may be connected by the inversion of the polarity of the well area. Accordingly, the speed of the erase operation of the memory device can be increased.

While the present invention has been described with respect to the specific embodiments, it will be apparent to those skilled in the art that various changes and modifications may be made without departing from the spirit and scope of the invention as defined in the following claims.

What is claimed is:

1. A 3D non-volatile memory device comprising:
a plate-type lower select line formed over a substrate;
a lower select transistor formed in the lower select line;
a plurality of memory cells stacked over the lower select transistor;
an upper select transistor formed over the memory cells;
a device isolation layer formed in the substrate;
a line-type common source line formed to be contacted with the device isolation layer and horizontally spaced from the lower select line; and
a line-type contact plug formed in parallel with the line-type common source line and formed over the lower select line.

2. The 3D non-volatile memory device of claim 1, further comprising a well area formed in the substrate between the lower select transistor and the common source line, wherein the common source line is formed over the device isolation layer and the well area.

3. The 3D non-volatile memory device of claim 2, wherein a channel of the lower select transistor and the common source line have a first conductive type, and the well area has a second conductive type different from the first conductive type.

4. The 3D non-volatile memory device of claim 1, wherein the common source line comprises a metallic layer.

5. The 3D non-volatile memory device of claim 1, wherein the lower select transistor comprises:
a channel arranged to project from the substrate and pass through the lower select line; and
a gate dielectric layer interposed between the channel and the lower select line.

* * * * *